(12) United States Patent
Frohberg et al.

(10) Patent No.: US 8,609,524 B2
(45) Date of Patent: Dec. 17, 2013

(54) METHOD FOR MAKING SEMICONDUCTOR DEVICE COMPRISING REPLACEMENT GATE ELECTRODE STRUCTURES WITH AN ENHANCED DIFFUSION BARRIER

(75) Inventors: Kai Frohberg, Niederau (DE); Frank Feustal, Dresden (DE); Thomas Werner, Reichenberg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 33 days.

(21) Appl. No.: 12/894,469

(22) Filed: Sep. 30, 2010

(65) Prior Publication Data
US 2011/0101426 A1    May 5, 2011

(30) Foreign Application Priority Data
Oct. 30, 2009 (DE) .......... 10 2009 046 260

(51) Int. Cl.
*H01L 21/3205* (2006.01)
*H01L 21/4763* (2006.01)
*H01L 21/8238* (2006.01)

(52) U.S. Cl.
USPC .......... 438/592; 438/591; 438/216; 438/689; 257/E21.158; 257/E21.409

(58) Field of Classification Search
USPC ......... 438/216, 618, 689, 585, 586, 592, 287, 438/591; 257/E21.158, E21.409
See application file for complete search history.

(56) References Cited

U.S. PATENT DOCUMENTS

| | | | | |
|---|---|---|---|---|
| 7,122,467 | B2 * | 10/2006 | Lee et al. | 438/637 |
| 7,126,199 | B2 * | 10/2006 | Doczy et al. | 257/412 |
| 7,563,678 | B2 * | 7/2009 | Koyama et al. | 438/275 |
| 2003/0003733 | A1 * | 1/2003 | Ohashi et al. | 438/689 |
| 2007/0077749 | A1 * | 4/2007 | Frohberg et al. | 438/618 |
| 2007/0099414 | A1 * | 5/2007 | Frohberg et al. | 438/618 |
| 2008/0157365 | A1 * | 7/2008 | Ott et al. | 257/750 |
| 2010/0270627 | A1 * | 10/2010 | Chang et al. | 257/411 |

* cited by examiner

*Primary Examiner* — Shouxiang Hu
(74) *Attorney, Agent, or Firm* — Williams, Morgan & Amerson, P.C.

(57) ABSTRACT

In sophisticated semiconductor devices, the integrity of the device level may be enhanced after applying a replacement gate approach by providing an additional diffusion barrier layer, such as a silicon nitride layer, thereby obtaining a similar degree of diffusion blocking capabilities as in semiconductor devices without performing a replacement gate approach.

14 Claims, 7 Drawing Sheets

METHOD FOR MAKING SEMICONDUCTOR DEVICE COMPRISING REPLACEMENT GATE ELECTRODE STRUCTURES WITH AN ENHANCED DIFFUSION BARRIER

BACKGROUND OF THE INVENTION

1. Field of the Invention

The present disclosure generally relates to the field of fabricating integrated circuits, and, more particularly, to complex integrated circuits that comprise metal gate electrode structures formed according to a replacement gate approach.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are steadily decreasing with the introduction of every new circuit generation, to provide currently available integrated circuits with a high performance in terms of speed and/or power consumption. A reduction of the size of transistors is an important aspect in steadily improving device performance of complex integrated circuits, such as CPUs. The reduction in size commonly brings about an increased switching speed, thereby enhancing signal processing performance.

In addition to the large number of transistor elements, a plurality of passive circuit elements, such as capacitors and resistors, are typically formed in integrated circuits as required by the basic circuit layout. Due to the decreased dimensions of circuit elements, not only the performance of the individual transistor elements may be improved, but also their packing density may be significantly increased, thereby providing the potential for incorporating increased functionality into a given chip area. For this reason, highly complex circuits have been developed, which may include different types of circuits, such as analog circuits, digital circuits and the like, thereby providing entire systems on a single chip (SOC).

With the increasing shrinkage of the features sizes of semiconductor-based circuit elements, such as transistors, thereby significantly increasing the overall complexity of the devices and the manufacturing processes, the complex wiring system also has to be adapted to the increasing number of circuit elements and the significantly increased packing density. Consequently, typically, in complex integrated circuits, a plurality of stacking wiring layers or metallization layers are required, in which metal lines and vias commonly establish the electrical connections as required by the circuit layout of the device under consideration. Due to the overall reduced feature sizes, the dimensions of metal lines and vias have also been continuously reduced, thereby requiring new strategies and materials for the complex metallization systems, since the high current densities and the close proximity of adjacent metal regions may result in non-acceptable thermal conditions and parasitic time constants when using well-established materials, such as silicon dioxide and aluminum. For this reason, copper in combination with so-called low-k dielectric materials are typically used in complex metallization systems which, however, may be associated with significant problems in view of the handling of copper in a semiconductor facility. It is well known that copper readily diffuses in a plurality of materials, such as silicon dioxide, silicon dioxide-based low-k dielectric materials and the like. However, copper diffusing into sensitive device areas, such as complex transistor elements, may significantly alter the transistor characteristics and may thus finally result in yield loss and reduced reliability of complex semiconductor devices. Therefore, copper material in metallization lines and vias has to be reliably confined, for instance on the basis of conductive and/or dielectric diffusion barrier materials, such as tantalum, tantalum nitride, silicon nitride and the like. Moreover, during the handling of copper material in a semiconductor production facility, any undue contamination of carrier materials and process tools and related equipment has to be suppressed as much as possible in view of transistor instabilities and the like. Furthermore, due to the complex metallization systems, a plurality of different material systems and reactive process atmospheres may have to be implemented in the overall process flow, which may also result in the diffusion of non-desired atomic species into sensitive device areas, thereby also contributing to variations of the device characteristics.

Consequently, in sophisticated semiconductor devices, an efficient diffusion barrier material, such as a silicon nitride material, may be provided above the transistor elements in order to prevent undue diffusion of copper and other unwanted species into the complex transistor elements. For this purpose, the contact level of the semiconductor device, i.e., the interlayer dielectric material provided in the device level so as to enclose and passivate the transistor elements, prior to forming any metallization layers, may include an appropriate silicon nitride material in combination with a silicon dioxide material, thereby obtaining a reliable confinement of a transistor element. In some recent developments in providing superior transistor elements, sophisticated gate electrode structures are provided in which a high-k dielectric material in combination with a metal-containing electrode material may be provided in a very advanced manufacturing stage, thereby, however, compromising integrity of the transistor elements, as will be explained in more detail with reference to FIGS. 1a-1d.

Figure 1A:
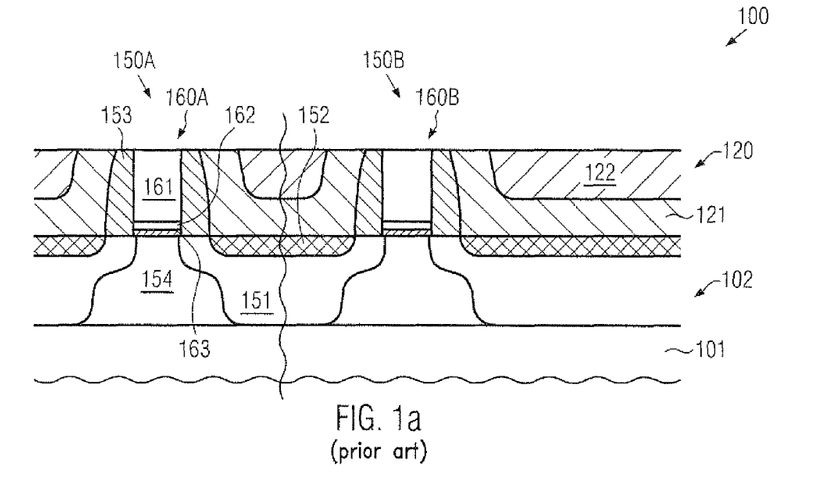
FIGS. 1a-1d schematically illustrate cross-sectional views of a semiconductor device when applying a replacement gate approach, according to conventional strategies.

FIG. 1a schematically illustrates a semiconductor device 100 in cross-sectional view which comprises a substrate 101 above which is formed a semiconductor layer 102. Typically, the substrate 101 may represent a silicon substrate, a silicon-on-insulator (SOI) substrate and the like. Similarly, the semiconductor layer 102 is a silicon-based material for forming therein and thereabove complex circuit elements, such as transistors 150A, 150B. The transistors 150A, 150B may comprise drain and source regions 151 in combination with metal silicide regions 152. Furthermore, the transistors 150A, 150B comprise gate electrode structures 160A, 160B, respectively, which may have a similar configuration for high performance transistors, even if the transistors 150A, 150B may represent transistors of different conductivity type. For example, the gate electrode structures 160A, 160B may comprise a gate dielectric material 163 in combination with a metal-containing cap material 162. Additionally, a polysilicon material 161 is provided, which may also be considered as a placeholder material since the material 161 will be replaced by a conductive material in a later manufacturing stage. Furthermore, the device 100 comprises a sidewall spacer structure 153 having any appropriate configuration so as to assist in forming the complex dopant profiles for the drain and source regions 151 and for providing the metal silicide regions 152. Additionally, a portion of a contact level 120 is provided in the form of dielectric materials 121 and 122, for instance in the form of silicon nitride and silicon dioxide, respectively.

The semiconductor device 100 as illustrated in FIG. 1a may be formed on the basis of the following conventional process strategies. After forming appropriate isolation structures in the semiconductor layer 102, such as shallow trench isolations (not shown), the gate electrode structures 160A, 160B may be formed by providing material layers for the materials 163, 162 and 161, which may be accomplished on the basis of any appropriate deposition techniques, surface treatment processes and the like. It should be appreciated that the gate dielectric material 163 may comprise a high-k dielectric material which is to be understood as a dielectric material having a dielectric constant of 10.0 and higher. In sophisticated field effect transistors, the current flow in a channel region 154 between the drain and source regions 151 is controlled by the gate electrode structure, wherein, typically, a reduction in length of the channel region 154, i.e., in FIG. 1a, the horizontal extension of the channel region 154 between the drain and source regions 151, may be associated with an increase of performance of the transistors 150A, 150B. Since the channel length is substantially determined by the length of the gate electrode structures 160A, 160B, i.e., in FIG. 1a, the horizontal extension of the material 161, critical dimensions of 50 nm and less have to be implemented in highly sophisticated field effect transistors. The reduction of the channel length and thus of the gate length, however, comes along with a reduced controllability of the channel region 154 for given supply voltages, which may typically require an increased capacitive coupling of the gate electrode to the channel region 154, which in turn may be realized by reducing the thickness of a gate dielectric material. Upon further device scaling, a well-established dielectric material silicon dioxide, which has been used as a base material for gate dielectric materials, may no longer be appropriate since, typically, a thickness of 1 nm and less would be required for maintaining the controllability of the channel region 154, which in turn results in extremely increased leakage current through extremely thin silicon dioxide-based gate dielectric material. Therefore, in sophisticated applications, alternative materials are increasingly used, possibly in combination with an extremely thin silicon dioxide layer, in order to provide a physically greater thickness while nevertheless obtaining the desired high capacitive coupling. For example, hafnium oxide and the like may be used in sophisticated gate dielectric materials. On the other hand, the new gate dielectric materials may require a corresponding adaptation of the work function, which may require the provision of specific metal species to be provided at or in the gate dielectric material 163. To this end, sophisticated approaches have been proposed in which the work function of P-channel transistors and N-channel transistors may be adjusted in an early manufacturing stage, i.e., prior to or upon patterning the gate electrode structures 160A, 160B. Corresponding approaches, however, may be associated with a plurality of difficulties in view of maintaining the work function stability throughout the entire process flow, in particular throughout high temperature processes, as are typically required for forming the drain and source regions 151. For this reason, so-called replacement gate approaches have been developed in which the gate dielectric material 163 including the high-k material may be confined by the conductive cap material 162 followed by the standard polysilicon material 161, thereby enabling the patterning of the gate electrode structures 160A, 160B on the basis of well-established process techniques. On the other hand, an appropriate electrode material in combination with work function adjusting metal species may be provided in a late manufacturing stage, i.e., at the manufacturing stage as shown in FIG. 1a. Consequently, after patterning the gate electrode structures 160A, 160B, the drain and source regions 151 in combination with the spacer structure 153 may be formed, including any anneal processes, and afterwards the metal silicide regions 152 may be formed. Thereafter, the dielectric materials 121 and 122 may be deposited on the basis of well-established process techniques. For example, the material 121 may be provided as a silicon nitride material, for instance with a high internal stress level, so as to enhance performance of one or both of the transistors 150A, 150B. Thereafter, the silicon dioxide material 122 may be deposited, and subsequently a planarization process, such as a chemical mechanical polishing (CMP) process, is performed to expose the placeholder material 161 of the gate electrode structures 160A, 160B. However, during the corresponding polishing process, the material 121 is also removed from above the gate electrode structures, thereby compromising the diffusion blocking effect of the contact level 120, which is typically provided by the material 121 having a high diffusion blocking effect, for instance with respect to copper.

Figure 1B:
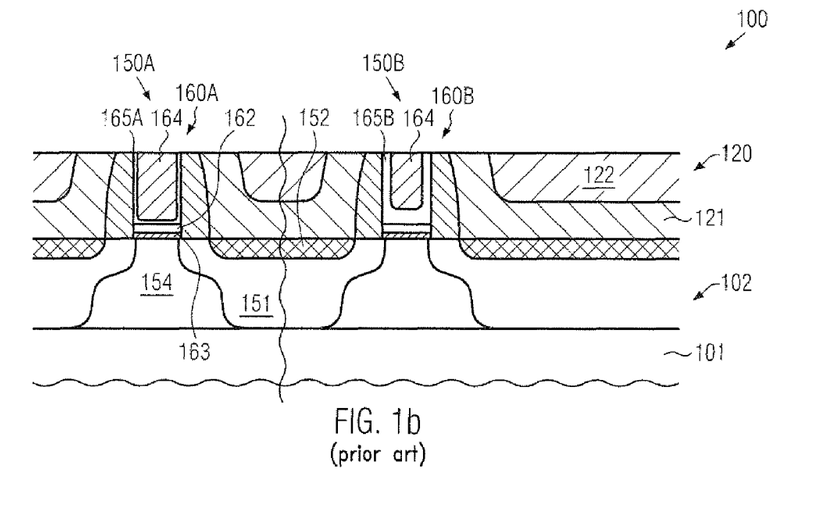

FIG. 1b schematically illustrates the device 100 in a further advanced manufacturing stage. As illustrated, the gate electrode structure 160A comprises an electrode material 164, such as aluminum, in combination with an additional metal-containing layer 165A that is appropriate for obtaining the desired work function in the gate electrode structure 160A. Similarly, the gate electrode structure 160B comprises the electrode material 164 and a material layer 165B that is appropriate for obtaining the desired work function for the transistor 150B. The corresponding process sequence for replacing the material 161 (FIG. 1a) and providing the various material systems 165A, 165B in combination with the electrode material 164 may be performed on the basis of any appropriate process strategy. During the removal of any excess metal, typically, a further polishing process may be applied, thereby possibly further compromising the protective characteristics of the material layer 121.

Figure 1C:
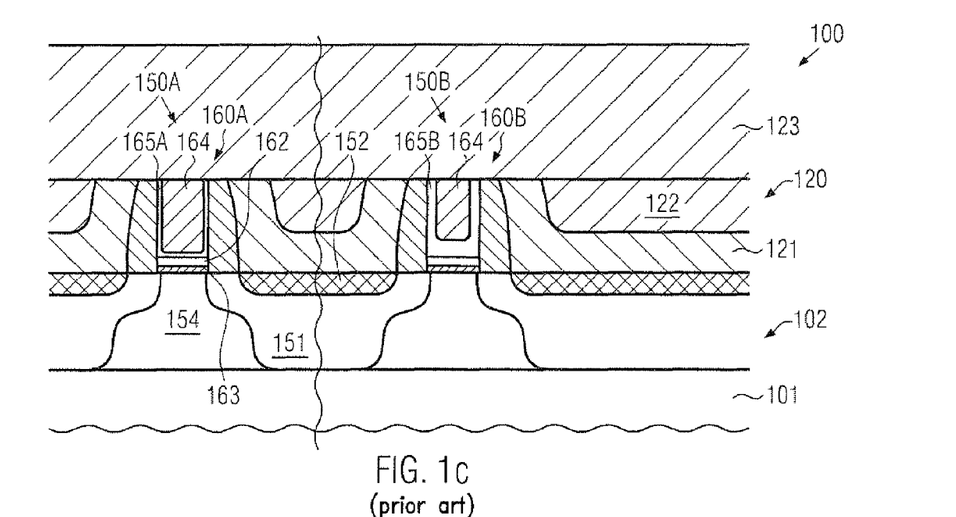

FIG. 1c schematically illustrates the device 100 with a further dielectric material 123 of the contact level 120. The material 123, which may also be referred to as interlayer dielectric material, is typically comprised of silicon dioxide, which represents a well-established interlayer dielectric material. Consequently, the material 123 may be in direct contact with the gate electrode structures 160A, 160B and any underlying material layers, which have been exposed upon removing a portion of the dielectric material 121. Consequently, during the further processing of the device 100, a significantly reduced degree of diffusion blocking effects may be provided by the contact level 120, since silicon dioxide may be significantly less efficient compared to silicon nitride, for instance with respect to copper diffusion.

Figure 1D:
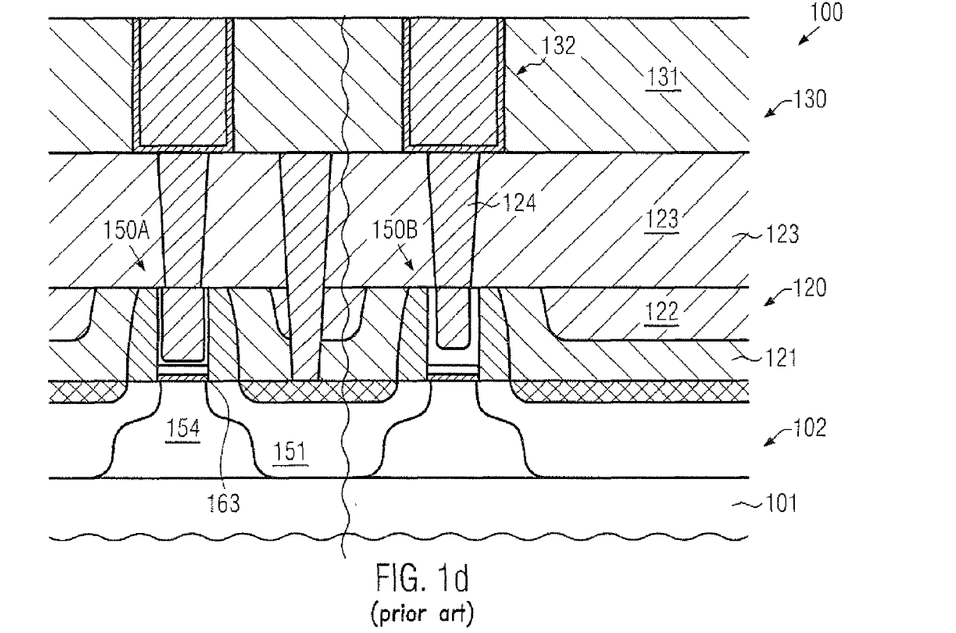

FIG. 1d schematically illustrates the device 100 in a further advanced manufacturing stage. As illustrated, contact elements 124 are provided in the contact level 120 and thus extend through the material 123 and possibly through the materials 122 and 121 in order to connect to various regions of the transistors 150A, 150B. The contact elements 124 comprise any appropriate conductive material, such as tungsten and aluminum, in sophisticated applications, copper may also be provided, and the like. Moreover, a metallization system 130, which for convenience is illustrated as a single metallization layer, is provided above the contact level 120 and may comprise any appropriate dielectric material 131 in combination with metal lines 132, which in turn may be comprised of copper in combination with conductive barrier materials, such as tantalum, tantalum nitride and the like. As previously discussed, upon forming the contact elements 124 and also during the process sequence for forming the metallization system 130, a plurality of critical materials and processes may have to be performed in which undue diffusion of specific species, in particular copper species, may occur through the various dielectric materials, thereby finally reaching the transistors 150A, 150B due to the reduced diffusion blocking effect of the silicon nitride layer 121. Hence, a pronounced variation of transistors characteristics may be caused, in particular if extremely scaled devices are considered. Thus, although a replacement gate approach may provide advantages in terms of stability of threshold voltages of the transistors due to a very late adjustment of the work function, the reduced integrity of the contact level may result in significant yield losses.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which superior integrity of the device level may be accomplished during a replacement gate approach by providing an additional diffusion barrier layer, at least above the replacement gate electrode structures. Furthermore, appropriate process strategies are provided in which the diffusion barrier material may be provided at an appropriate manufacturing stage without unduly affecting further processing, for instance the patterning of the interlayer dielectric material and the formation of contact elements.

One illustrative semiconductor device disclosed herein comprises a transistor element comprising a gate electrode structure. The gate electrode structure in turn comprises a high-k dielectric material and a metal-containing electrode material that is formed above the high-k dielectric material. The semiconductor device further comprises a dielectric material formed laterally adjacent to the gate electrode structure. Furthermore, a diffusion barrier layer is formed above the gate electrode structure. Additionally, a metallization system is formed above the diffusion barrier layer and comprises a metal region including a metal species, wherein the diffusion barrier layer is configured to suppress at least diffusion of the metal species.

One illustrative method disclosed herein comprises forming a dielectric material laterally adjacent to a gate electrode structure of a transistor formed above a semiconductor region. The gate electrode structure comprises a high-k dielectric material and a semiconductor material. The method further comprises forming a replacement gate electrode structure by replacing the semiconductor material with a metal-containing material. Furthermore, the method comprises forming a copper diffusion barrier layer at least above the replacement gate structure. Additionally, the method comprises forming an interlayer dielectric material above the copper diffusion barrier layer.

A further illustrative method disclosed herein comprises forming a diffusion barrier layer above a replacement gate electrode structure of a transistor. The method additionally comprises forming an interlayer dielectric material above the diffusion barrier layer. Furthermore, the method comprises forming a contact element in the interlayer dielectric material and the diffusion barrier layer and forming a metallization system above the interlayer dielectric material.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which the integrity of the device layer in view of the diffusion of any unwanted species, such as copper and the like, may be enhanced after replacing a placeholder material by a metal-containing electrode material by subsequently providing a diffusion barrier layer. For this purpose, any appropriate material, such as silicon nitride, conductive barrier materials, such as tantalum nitride, titanium nitride and the like, may be formed, at least above the replacement gate electrode structure, so as to "re-conceal" the device level prior to performing any further processes, such as the fabrication of contact elements and the provision of a metallization system.

With reference to FIGS. 2a-2i, further illustrative embodiments will now be described in more detail, wherein reference may also be made to FIGS. 1a-1d, for instance in view of process strategies for forming sophisticated transistor elements in combination with replacement gate electrode structures.

Figure 2A:
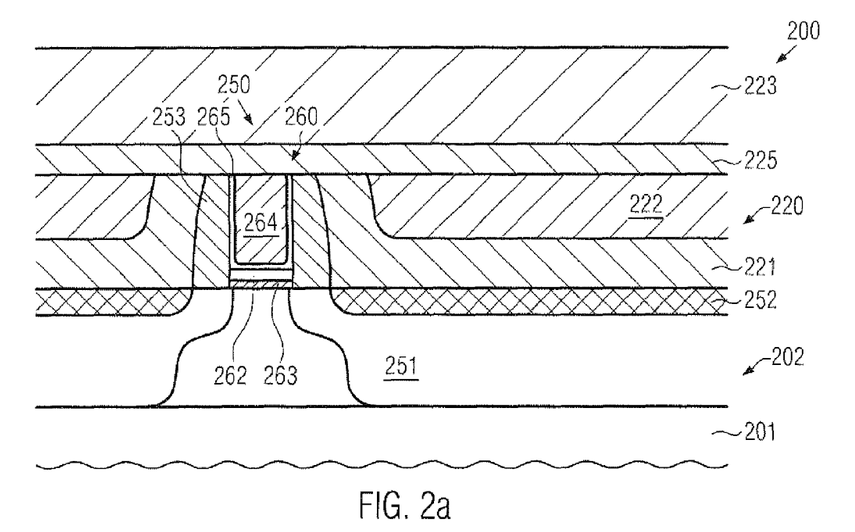
FIGS. 2a-2b schematically illustrate cross-sectional views of a semiconductor device during various manufacturing stages in which a replacement gate electrode structure has superior diffusion blocking characteristics due to the provision of an additional diffusion barrier layer, according to illustrative embodiments.

FIG. 2a schematically illustrates a cross-sectional view of a semiconductor device 200 in an advanced manufacturing stage. As illustrated, the device 200 may comprise a substrate 201 in combination with a semiconductor layer 202, in and above which a transistor 250 may be formed. The transistor 250 may comprise drain and source regions 251 in combination with metal silicide regions 252, if required. Furthermore, the transistor 250 may comprise a gate electrode structure 260, which may also be referred to as a replacement gate electrode structure in the manufacturing stage shown, since the structure 260 may comprise a metal electrode material 264 in combination with a material system 265 for adjusting the work function of the structure 260, wherein these materials have replaced a placeholder material, such as a polysilicon material and the like, as is also previously described with reference to the device 100. Furthermore, the gate electrode structure 260 may comprise a gate dielectric material 263, which may include a high-k dielectric material, which may be confined on the basis of a conductive cap material 262, such as a titanium nitride material and the like. Furthermore, the transistor 250 may comprise a spacer structure 253, for instance in the form of silicon nitride, silicon dioxide and the like.

It should be appreciated that the transistor 250 and the replacement gate electrode structure 260 may have any appropriate configuration, as is also described with reference to the semiconductor device 100. For example, a gate length of the structure 260 may be 40 nm and less in sophisticated applications. Furthermore, in the manufacturing stage shown, the device 200 may comprise a contact level 220 comprising, for instance, a dielectric material 221, such as a silicon nitride material, or any other appropriate material, since, in the embodiment shown, a pronounced diffusion blocking effect of the material 221 may not be required. Moreover, a further dielectric material 222, such as a silicon dioxide material and the like, may be provided. It should be appreciated that one or both of the materials 221, 222 may be provided with a high internal stress level so as to enhance performance of the transistor 250. Furthermore, a diffusion barrier layer 225 may be formed above the gate electrode structure 260 and above the material 222, thereby providing superior diffusion blocking capabilities, for instance in view of copper diffusion or the diffusion of any other unwanted species. In one illustrative embodiment, a diffusion barrier layer may be provided as a silicon nitride-based material having a thickness of approximately 10-50 nm. It should be appreciated, however, that any other thickness value may be selected as long as the desired diffusion blocking effect may be ensured. In the embodiment shown, the diffusion barrier layer 225 may be formed "on" the gate electrode structure 260, i.e., the material 225 may be in contact with at least the electrode metal 264. In other cases, a material may be provided between the diffusion barrier layer 225 and the gate electrode structure 260. It should be appreciated that the diffusion barrier layer 225 may be comprised of several sub-layers of which at least one layer may have substantially no diffusion blocking capabilities, as will be described later on in more detail. In the embodiment shown in FIG. 2a, it may be assumed, however, that a diffusion blocking material, such as silicon nitride and the like, may be directly formed on the gate electrode structure 260, thereby also providing superior confinement in critical device areas, such as edges of gate electrode structures formed above isolation regions and the like.

Moreover, the contact level 220 may comprise a further dielectric material 223, which may also be referred to as an interlayer dielectric material, and which may have any appropriate composition and characteristics, as required. For example, the material 223 may be provided in the form of a silicon dioxide material.

The semiconductor device 200 may be formed on the basis of the following processes. The transistor 250 comprising the replacement gate electrode structure 260 may be formed by process strategies as are also discussed above with reference to the semiconductor device 100. Thus, after replacing a placeholder material of the gate electrode structure 260 by the materials 265 and 264 and after any patterning processes for providing appropriate work function adjusting species in other gate electrode structures, as previously discussed with reference to the gate electrode structures 160A, 160B in FIGS. 1a-1d, the diffusion barrier layer 225 may be deposited, for instance, on the basis of plasma enhanced chemical vapor deposition (CVD) techniques, physical vapor deposition (PVD) techniques and the like, depending on the material characteristics and the like. For example, silicon nitride and other related materials having a high copper diffusion blocking effect may be formed on the basis of well-established plasma enhanced deposition techniques. Thereafter, the interlayer dielectric material 223 may be deposited on the basis of any appropriate process strategy. Thereafter, the further processing may be continued by patterning the contact level 220 so as to form contact openings therein, which may be subsequently filled with any appropriate conductive material.

Figure 2B:
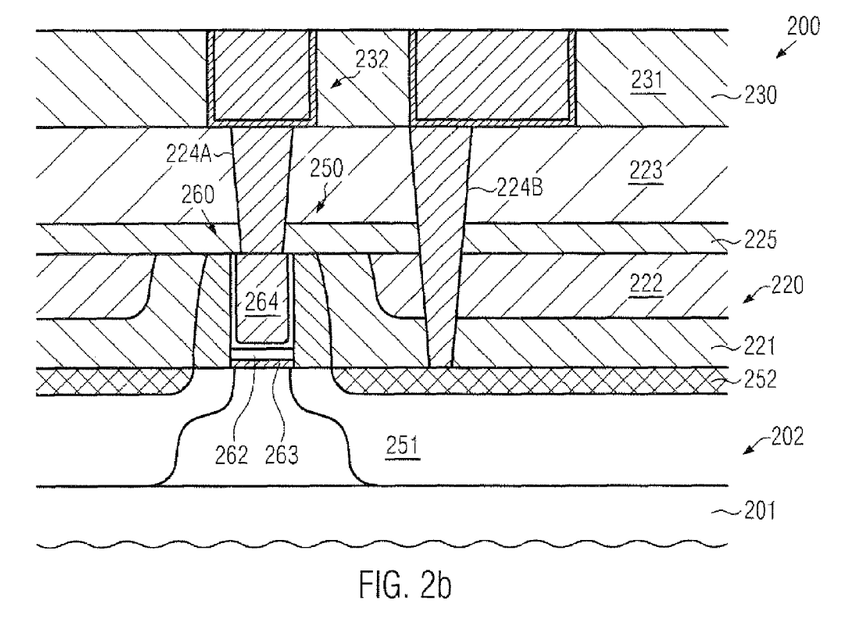

FIG. 2b schematically illustrates the semiconductor device 200 in a further advanced manufacturing stage. As shown, the contact level 220 may comprise contact elements 224A, 224B so as to connect to the gate electrode structure 260 and to the drain or source regions 251. Thus, the contact element 224A may extend through the interlayer dielectric material 223 and the diffusion barrier layer 225, while the contact element 224B may further extend through the materials 222 and 221.

Consequently, due to the presence of the diffusion barrier layer 225, the gate electrode structure 260 may be continuously covered, except for areas in which the contact element 224A may extend to the gate electrode structure 260, thereby providing a similar degree of diffusion blocking effect as in semiconductor devices in which the gate electrode structures may be formed and finalized in an early manufacturing stage.

Moreover, the device 200 may comprise a metallization system 230, which is shown to be represented by a single metallization layer, for convenience. The metallization layer 230 may comprise any appropriate dielectric material 231 and metal regions 232, such as copper-based metal regions.

The device 200 may be formed on the basis of the following process techniques. The contact level 220 may be patterned by, for instance, providing an appropriate etch mask, such as a hard mask, which may be obtained on the basis of appropriate lithography techniques. Based on the etch mask, corresponding openings for the contact elements 224A, 224B may be formed by applying appropriate anisotropic etch recipes. For instance, the material 223 may be etched selectively with respect to the diffusion barrier layer 225 and subsequently the etch recipe may be changed so as to etch through the diffusion barrier layer 225, while the etch front may be stopped on and in the electrode material 264. Thereafter, the etch chemistry may again be changed so as to etch through the material 222 and finally the layer 221 may be opened. For this purpose, well-established etch chemistries may be applied. Thereafter, any desired contact material may be filled into the openings, for instance on the basis of CVD and the like, followed by the removal of any excess material, for instance by CMP. Next, the metallization layer 230 may be formed by applying any appropriate process technique.

Figure 2C:
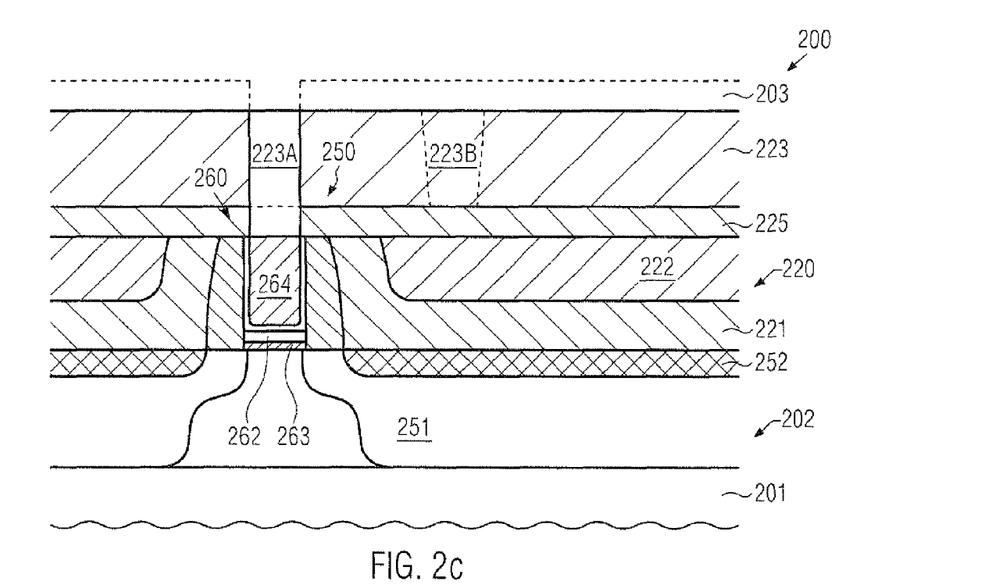
FIGS. 2c-2d schematically illustrate cross-sectional views of the semiconductor device in which a patterning strategy in the presence of the additional diffusion barrier layer is illustrated, according to further illustrative embodiments.

FIG. 2c schematically illustrates the semiconductor device 200 according to further illustrative embodiments in which a modified patterning sequence may be applied. As illustrated, a first contact opening 223A may be formed in the interlayer dielectric material 223 based on a first etch mask 203, such as a hard mask and the like. For this purpose, any appropriate etch recipe may be applied. For example, the opening 223A may extend to the gate electrode structure 260 or may extend to the diffusion barrier layer 225. In this case, superior integrity of the gate electrode structure 260 during the further processing may be achieved. In some illustrative embodiments, a portion of a second contact opening 223B may be formed in the material 223 on the basis of the etch mask 203. In other cases, the opening 223B may not be provided in this manufacturing stage. Thereafter, the etch mask 203 may be removed on the basis of any appropriate removal process, such as an oxygen plasma-based process, when the etch mask 203 may be comprised of a carbon material.

Figure 2D:
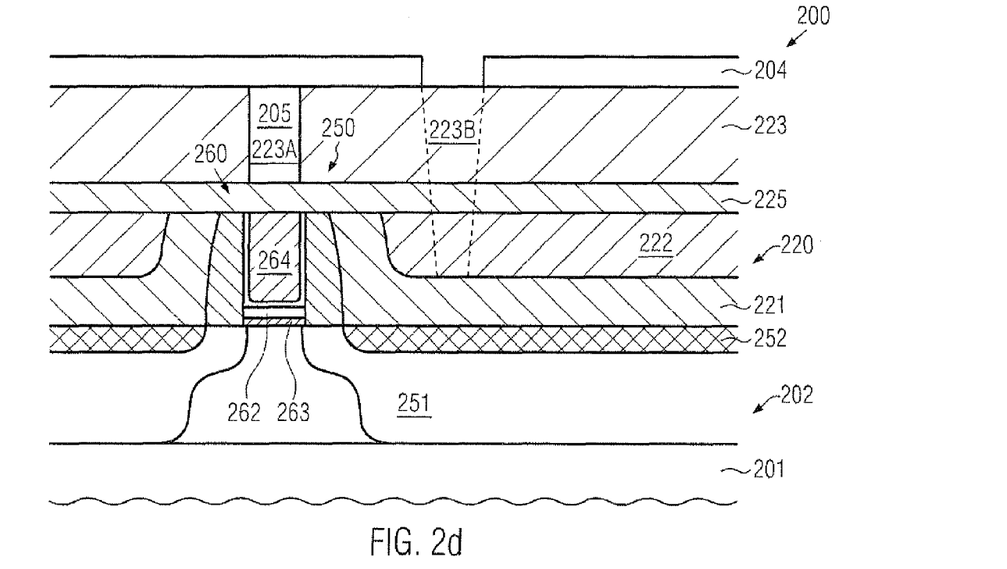

FIG. 2d schematically illustrates the device 200 in a further advanced manufacturing stage in which a second etch mask 204 may be provided above the dielectric material 223 in order to define the lateral position and size of the second contact opening 223B. The first contact opening 223A may be filled with a planarization material 205, such as an organic polymer material and the like. For this purpose, the material 205 may be applied, for instance, by spin-on techniques and may be hardened on the basis of any well-established process strategy. Thereafter, any excess material may be removed, for instance, by CMP, etching and the like. Thereafter, the etch mask 204 may be provided on the basis of an associated lithography process. It should be appreciated that, if a first portion of the opening 223B has already been formed during the preceding processing, a corresponding planarization material may also be provided in a corresponding first portion of the opening 223B. Thereafter, the further processing may be continued by forming the opening 223B so as to extend through the materials 223, 225, 222 and 221. In other cases, the etch process may be stopped on the layer 221 and, thereafter, the etch mask 204 may be removed together with the planarization material 205, which may be accomplished by an oxygen plasma-based process and the like. Thereafter, the diffusion barrier layer 225 above the gate electrode structure 260 and the material layer 221 may be opened in a common etch process. In this case, integrity of the gate electrode structure 260 may be preserved until the etch process for opening the layers 225, 221.

Figure 2E:
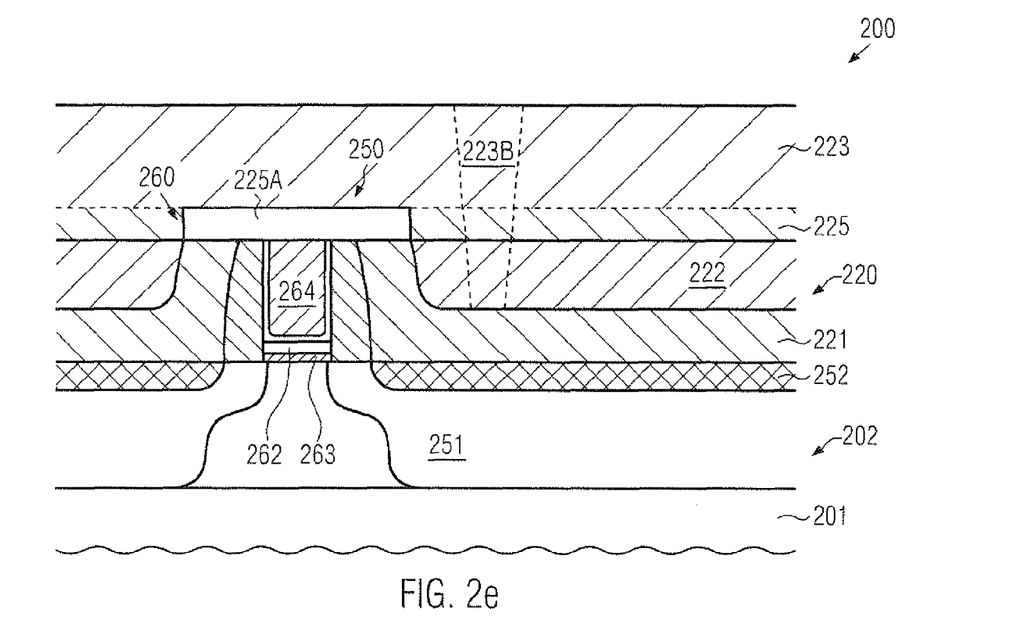
FIG. 2e schematically illustrates a cross-sectional view of the semiconductor device according to illustrative embodiments in which the additional diffusion barrier layer may be locally positioned above the replacement gate electrode structure.

FIG. 2e schematically illustrates the semiconductor device 200 according to further illustrative embodiments in which the diffusion barrier layer 225 may be provided locally above the gate electrode structure 260. For this purpose, the layer 225 may be patterned so as to maintain a portion thereof, indicated as 225A, above the gate electrode structure 260, wherein a lateral extension of the portion 225A may be selected so as to obtain the desired high integrity, while nevertheless substantially not interfering with a patterning process for forming the contact opening 223B. Consequently, during the further processing, the layer portion 225A may provide similar process conditions as in semiconductor devices in which a replacement gate approach is not applied.

Figure 2F:
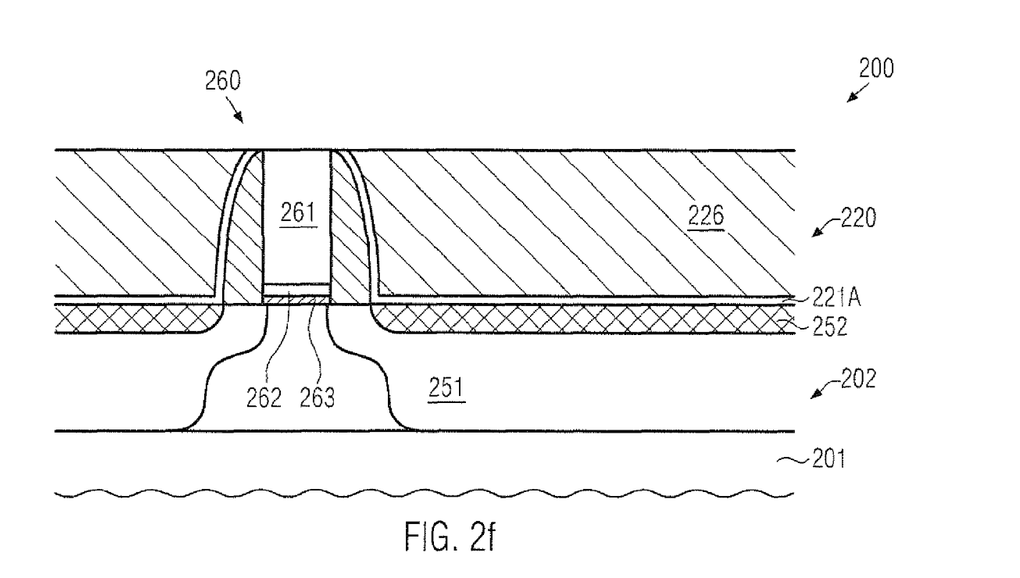
FIGS. 2f-2h schematically illustrate cross-sectional views of the semiconductor device during various manufacturing stages in which a replacement gate approach may be applied on the basis of a sacrificial material that may be removed prior to applying the diffusion barrier layer, according to still further illustrative embodiments.
Figure 2G:
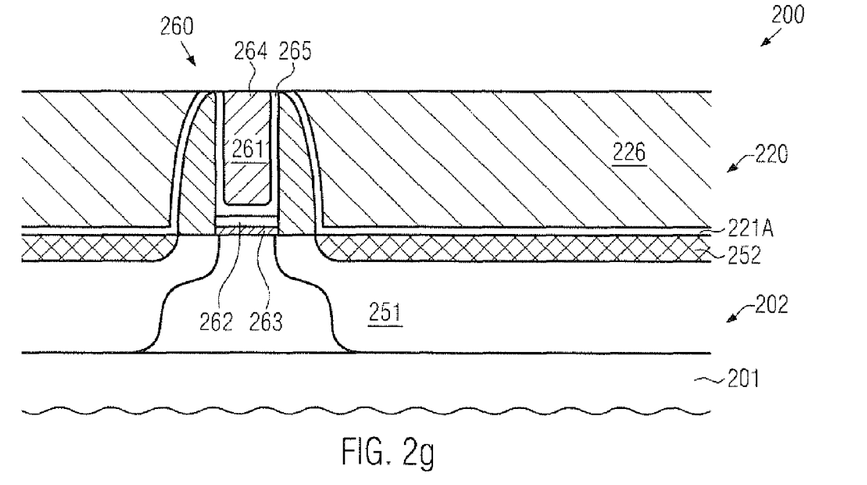
Figure 2H:
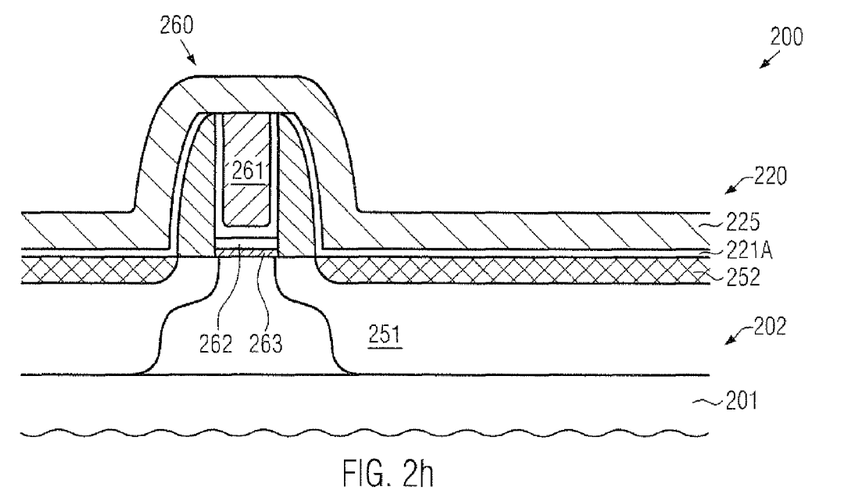

With reference to FIGS. 2f-2h, further illustrative embodiments will now be described in which the replacement of a placeholder electrode material may be accomplished on the basis of a sacrificial material.

FIG. 2f schematically illustrates the semiconductor device 200 in a manufacturing stage in which the gate electrode structure 260 may still comprise a placeholder material 261, such as a polysilicon material. Moreover, a contact level 220 may be provided on the basis of a dielectric material 221A, for instance in the form of a silicon nitride material, however, with a reduced thickness. Furthermore, a sacrificial material 226, such as a silicon dioxide material and the like, may be provided. For this purpose, the material 221A may be deposited with a desired thickness, and possibly with a desired internal stress level, followed by the deposition of the material 226, which may be subsequently planarized, thereby also exposing the material 261.

FIG. 2g schematically illustrates the device 200 in a further advanced manufacturing stage in which the electrode metal 264 and the work function adjusting material system 265 are formed in the gate electrode structure 260. To this end, any well-established process techniques may be applied, as previously discussed. Thereafter, the sacrificial material 226 may be removed, for instance, by etching the material 226 selectively to the gate electrode structure 260 and the material 221A. It should be appreciated that the material 226 may be provided in any other appropriate manner, as long as the material 226 may withstand the process conditions for replacing the material 261 with the materials 264, 265, which may involve one or more polishing processes.

FIG. 2h schematically illustrates the semiconductor device 200 in a further advanced manufacturing stage in which the diffusion barrier layer 225 may be formed above the material 221A and the gate electrode structure 260 after the removal of the sacrificial material 226, as shown in FIG. 2g. Thereafter, the processing may be continued by depositing an interlayer dielectric material and patterning the same, in accordance with any well-established process strategy.

Figure 2I:
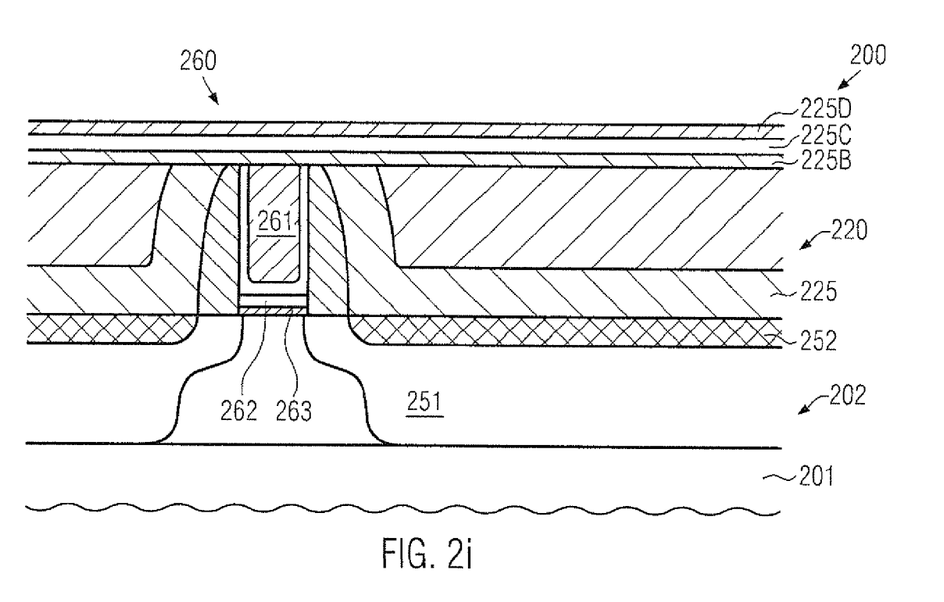
FIG. 2i schematically illustrates a cross-sectional view of the semiconductor device in which the diffusion barrier layer may comprise a plurality of individual layers, according to still further illustrative embodiments.

FIG. 2i schematically illustrates the semiconductor device 200 in accordance with embodiments in which the diffusion barrier layer may comprise two or more sub-layers. In the embodiment shown, the layer 225 may comprise a diffusion barrier material 225C, which may be confined by materials 225B, 225D, which may not necessarily provide a high diffusion blocking capability. For instance, a plurality of materials, such as tantalum nitride, titanium nitride and the like, may have a sufficient diffusion blocking effect, possibly in combination with tantalum, titanium and the like, while these materials may additionally be provided with a high internal stress level. In order to preserve the electrical integrity of the device 200, these materials may be confined by the dielectric layers 225B, 225D, such as silicon dioxide materials and the like, so as to provide a high internal stress level in combination with diffusion blocking capabilities. It should be appreciated, however, that any other composition of the layer 225 may be used as long as the required diffusion blocking effect is obtained. It is to be noted that upon patterning the layer 225, for instance when forming contact openings therein, an additional sidewall spacer element may be formed in the contact opening so as to electrically isolate the layer 225C, if provided in the form of an electrically conductive material.

As a result, the present disclosure provides semiconductor devices and manufacturing techniques in which superior confinement of a device level may be achieved after applying a replacement gate approach. For this purpose, a diffusion barrier layer may be provided, at least locally above the gate electrode structure, after replacing the placeholder electrode material by a metal-containing material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a dielectric material laterally adjacent to a gate electrode structure of a transistor formed above a semiconductor region, said gate electrode structure comprising a high-k dielectric material and a placeholder material;
   forming a replacement gate electrode structure by replacing said placeholder material with a metal-containing material;
   forming a copper diffusion barrier layer above said dielectric material and said replacement gate electrode structure;
   forming an interlayer dielectric material above said copper diffusion barrier layer;
   forming a first contact opening that extends through said interlayer dielectric material, said copper diffusion barrier layer and said dielectric material so as to expose one of a drain region and a source region of said transistor, said copper diffusion barrier layer completely surrounding said first contact opening where said first contact opening extends therethrough, wherein forming said first contact opening comprises providing a first etch mask to form at least a portion of said first contact opening;
   forming a second contact opening that extends through said interlayer dielectric material and said copper diffusion barrier layer so as to expose said metal-containing material of said replacement gate electrode structure, wherein forming said second contact opening comprises providing a second etch mask to form at least a portion of said second contact opening; and
   after forming said first contact opening through said interlayer dielectric material, said copper diffusion barrier layer and said dielectric material, forming a first contact element that connects to said one of said drain region and said source region by filling said first contact opening with a contact material.

2. The method of claim 1, wherein forming said copper diffusion barrier layer comprises forming a silicon nitride based material layer.

3. The method of claim 1, further comprising planarizing said interlayer dielectric material including at least a portion of one of said first and second contact openings and forming at least a further portion of the other one of said first and second contact openings.

4. The method of claim 1, wherein forming said copper diffusion barrier layer comprises depositing at least a portion of said copper diffusion barrier layer so as to have an internal stress level of 1 GPa or higher.

5. The method of claim 1, wherein said copper diffusion barrier layer is formed in contact with said metal-containing material of said replacement gate electrode structure.

6. The method of claim 1, further comprising, after forming said second contact opening through said interlayer dielectric material and said copper diffusion barrier layer, forming a second contact element that connects to said metal-containing material of said replacement gate electrode structure by filling said second contact opening with said contact material during a common deposition process that is used to fill said first contact opening.

7. A method, comprising:
   forming a diffusion barrier layer above a transistor element comprising a replacement gate electrode structure, wherein said replacement gate electrode structure is laterally surrounded by at least a first dielectric layer formed above source and drain regions of said transistor and a second dielectric layer that is formed above said first dielectric layer;
   forming an interlayer dielectric material above said diffusion barrier layer;
   forming a first contact opening above said replacement gate electrode structure, said first contact opening extending through at least said interlayer dielectric material;
   after forming said first contact opening through at least said interlayer dielectric material, forming a first contact element in said first contact opening, said first contact element connecting to an electrode material of said replacement gate electrode structure;
   after forming said first contact opening, performing an etch process to form a second contact opening above a contact region in one of said source and drain regions, said second contact opening extending through said interlayer dielectric material, said diffusion barrier layer, and at least said second dielectric layer, wherein said diffusion barrier layer completely surrounds said second contact opening where said second contact opening extends therethrough; and
   after forming said second contact opening through said interlayer dielectric material, said diffusion barrier layer, and at least said second dielectric material, forming a second contact element in said second contact opening, said second contact element connecting to said contact region.

8. The method of claim 7, wherein said diffusion barrier layer is formed in contact with an electrode material of said replacement gate electrode structure.

9. The method of claim 8, further comprising filling said first contact opening with a planarization material prior to forming said second contact opening.

10. The method of claim 9, further comprising, after forming said second contact opening, removing said planarization material from said first contact opening, extending said first contact opening through said diffusion barrier layer to expose said electrode material, and extending said second contact opening through said first dielectric layer to expose said contact region.

11. The method of claim 10, wherein extending said first and second contact openings comprises performing a common etch process.

12. The method of claim 7, further comprising covering said first contact opening with a mask layer and using a mask opening formed in said mask layer to form said second contact opening.

13. A method, comprising:
forming a plurality of dielectric material layers above a transistor element, said transistor element comprising a gate electrode structure formed above a semiconductor region and source and drain regions formed in said semiconductor region, said plurality of dielectric material layers laterally surrounding said gate electrode structure, and said gate electrode structure comprising a high-k gate dielectric material and a polysilicon material formed thereabove;
performing a planarization process on said plurality of dielectric material layers to expose said polysilicon material of said gate electrode structure;
forming a replacement metal gate electrode structure by replacing said polysilicon material above said high-k gate dielectric material with at least a conductive cap material and a metal-containing electrode material;
forming a diffusion barrier layer above said replacement gate electrode structure and said plurality of dielectric material layers;
forming an interlayer dielectric material above said diffusion barrier layer;
performing a first etch process to form a first portion of a first contact opening above said metal-containing electrode material and a first portion of a second contact opening above a contact region in one of said source and drain regions by using said diffusion barrier layer as an etch stop layer;
filling said first portions of said first and second contact openings with a planarization material;
removing said planarization material from said first portion of said second contact opening; and
performing a second etch process to form a second portion of said second contact opening by extending said second contact opening through said diffusion barrier layer and at least one of said plurality of dielectric material layers, said diffusion barrier layer completely surrounding said second contact opening where said second contact opening extends therethrough.

14. The method of claim 13, further comprising forming first and second contact elements by filling said first and second contact openings, respectively, with a conductive contact material during a common deposition process, said first contact element connecting to said metal-containing electrode material and said second contact element connecting to said contact region.

* * * * *